Figure 1:
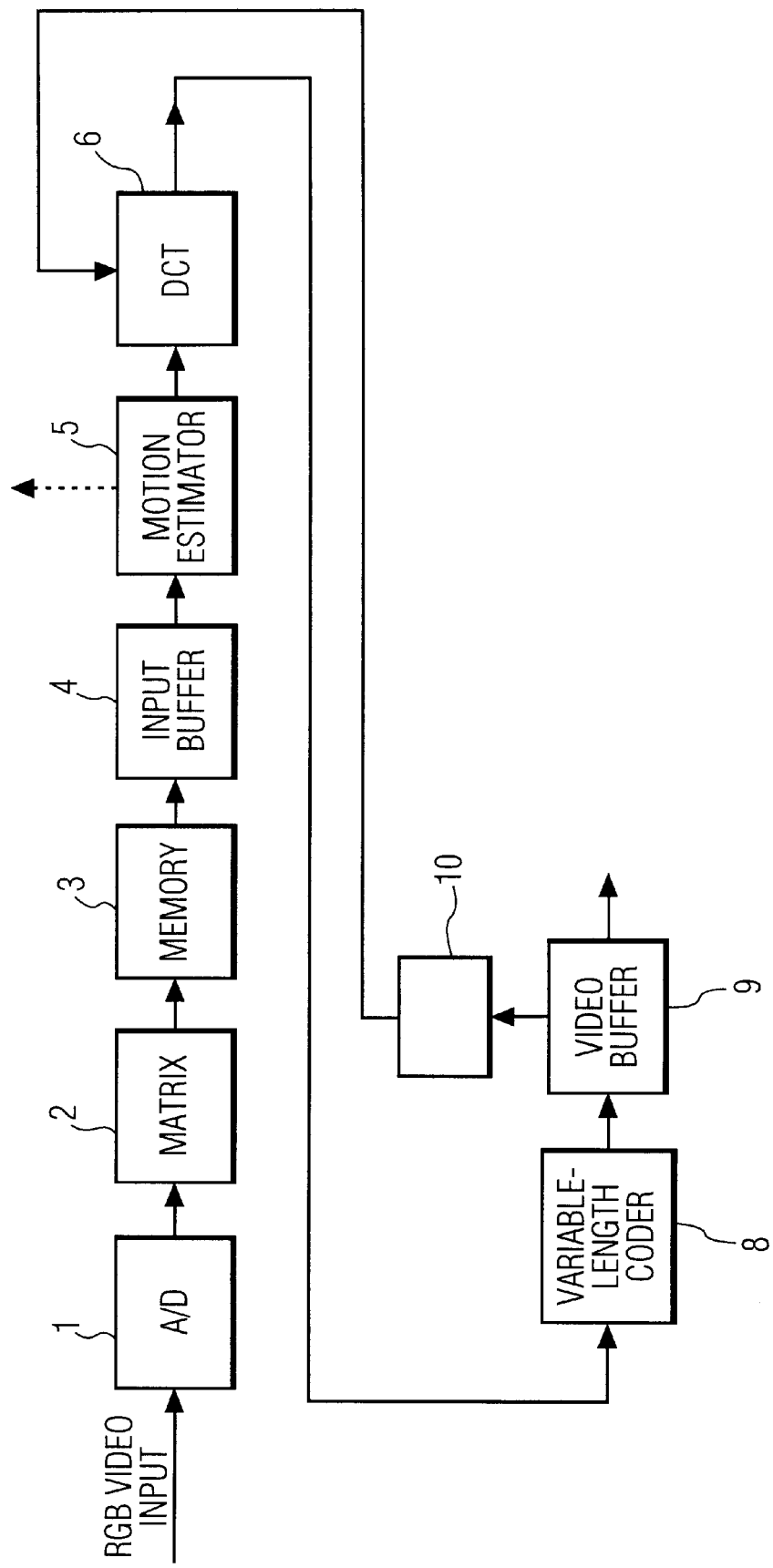

United States Patent [19]
Yassa

[11] Patent Number: 6,023,294
[45] Date of Patent: Feb. 8, 2000

[54] BIT BUDGET ESTIMATION METHOD AND DEVICE FOR VARIABLE WORD LENGTH ENCODERS

[75] Inventor: Fathy Yassa, Troinex, Switzerland

[73] Assignee: Thomson multimedia S.A., Courbevoie, France

[21] Appl. No.: 08/581,573

[22] PCT Filed: Jul. 19, 1994

[86] PCT No.: PCT/FR94/00900

§ 371 Date: May 16, 1996

§ 102(e) Date: May 16, 1996

[87] PCT Pub. No.: WO95/03673

PCT Pub. Date: Feb. 2, 1995

[30] Foreign Application Priority Data

Jul. 20, 1993 [FR] France .................................. 93 08892

[51] Int. Cl.[7] .................................................. H04N 7/24
[52] U.S. Cl. .......................... 348/390; 348/384; 348/410; 382/246; 375/240; 375/241; 375/246; 375/253
[58] Field of Search ................................... 348/405, 419, 348/390, 395, 384, 410; 364/715.09, 604; 382/244–246; 375/240–241, 246, 253

[56] References Cited

U.S. PATENT DOCUMENTS

| | | | |
|---|---|---|---|
| 4,259,693 | 3/1981 | Aaron et al. ........................... | 358/261.2 |
| 4,363,036 | 12/1982 | Subramaniam ....................... | 358/261.2 |
| 4,413,289 | 11/1983 | Weaver et al. .............................. | 360/51 |
| 4,791,403 | 12/1988 | Mitchell et al. ........................... | 341/51 |
| 4,933,883 | 6/1990 | Pennebaker et al. ................. | 364/921.8 |
| 4,984,076 | 1/1991 | Watanabe et al. ....................... | 348/405 |
| 5,038,209 | 8/1991 | Hang ........................................ | 348/405 |
| 5,099,440 | 3/1992 | Pennebaker et al. ................. | 364/955.5 |
| 5,134,480 | 7/1992 | Wang et al. ............................. | 348/620 |
| 5,170,264 | 12/1992 | Saito et al. .............................. | 348/405 |
| 5,231,484 | 7/1993 | Gonzales et al. ....................... | 348/405 |
| 5,241,535 | 8/1993 | Yoshikawa .............................. | 370/394 |
| 5,272,478 | 12/1993 | Allen et al. ............................. | 341/107 |
| 5,381,145 | 1/1995 | Allen et al. ............................. | 348/397 |
| 5,434,623 | 7/1995 | Coleman et al. ....................... | 348/405 |
| 5,489,943 | 2/1996 | Kutner .................................... | 348/419 |
| 5,585,853 | 12/1996 | Juri et al. ................................ | 348/419 |

FOREIGN PATENT DOCUMENTS

| | | | |
|---|---|---|---|
| 0419141 | 3/1991 | European Pat. Off. ......... | H04N 7/32 |
| 0480353 | 4/1992 | European Pat. Off. ......... | H04N 7/32 |

OTHER PUBLICATIONS

A. Netravali and B. Haskell, "Digital pictures: representation and compression", 1988, Plenum Press, New York, pp. 148–155.

*Primary Examiner*—Vu Le
*Attorney, Agent, or Firm*—Joseph S. Tripoli; Eric P. Herrmann

[57] ABSTRACT

The invention is a process and apparatus for estimating a bit budget in a circuit for compressing digital data, especially digitized television signals. Signals represented by N-bit coded samples, are estimated based upon the probability of a bit of given order having a given value (0 or 1) out of M binary words representing M samples of the signal. An entropy calculation is performed on the basis of the probabilities corresponding to the N bits with the sum of all the entropies corresponding to the desired estimate.

6 Claims, 3 Drawing Sheets

BIT BUDGET ESTIMATION METHOD AND DEVICE FOR VARIABLE WORD LENGTH ENCODERS

The present invention relates to a process for estimating a bit budget for encoders with variable word length, as well as to an image compression device implementing this process.

In the field of image compression, especially in the field of high-definition television, the images to be compressed are subjected to various processing operations (motion estimation, transformation to the frequency domain, for example by DCT ("Discrete Cosine Transformation")), before the data thus obtained are coded for transmission. To eliminate the redundant data whilst preserving the integrity of the information, use may be made of coding processes with variable word length ("Variable length coding" or VLC). These processes take into account the probability with which the data appear among the set of words which are possible for these data. The words which appear often will then be coded by short binary words and the words which appear less often will be coded by longer binary words. The consequence of this will be a reduction in the mean word length, that is to say a reduction in the number of bits to be transmitted. The document EP-A-0 419 141 describes a variable length coding method.

An example of a device using such variable-length coding is described below.

According to a simplified example of a compression circuit represented in FIG. 1, an RGB video signal is digitized by an analog/digital converter 1, feeding an RGB/YUV conversion matrix 2, whose output is connected to a picture memory 3. An input buffer 4 forms the interface between the picture memory 3 and the motion estimator(s) 5. The results of this or these estimation(s) are processed by circuits which are not represented in FIG. 1. The signal is furthermore subjected to a discrete cosine transformation combinations of non-zero coefficients and of lengths of series of non-zero coefficients are finally coded by a variable-length coding process of known type, for example coding by the Huffman method (circuit 8). A buffer 9 gathers the compressed signal leaving the coder, outputting it as a function of the capacity of the transmission channel, this channel not being represented in FIG. 1. A problem arises when the buffer 9 is filled more quickly than it is emptied. In certain cases, this may lead to an overflow of the buffer and hence to a loss of data. To avoid this problem, a throughput adjustment feedback loop 10 controls the quantizing of the coefficients of the DCT, and consequently the throughput of data to the buffer 9. It therefore seems to be necessary to carry out VLC coding of the data before being able to ascertain the corresponding bit budget, that is to say the number of bits required to code the signal or the signal portion in compressed form. This solution is unsatisfactory since it is necessary to perform a number of purposeless calculations, if the coding is performed in two passes, the first intended for a first estimate of the bit budget, the second for the coding per se, possibly with a correction depending on the results of the first pass. This results in a loss of time and energy, as well as increased complexity of the circuits.

The purpose of the invention is to avoid these drawbacks.

The purpose of the invention is moreover to allow estimation of the data throughput leaving the coder, and to do so before the variable word length coding.

The subject of the invention is a process for estimating a bit budget in a circuit for compressing digital data, especially digitized television signals, characterized in that, the signals being represented by N-bit samples, the estimate is based on the probability of a bit of given order having a given value out of M binary words representing M samples of signal, an entropy calculation being performed on the basis of the probabilities corresponding to the N bits, the sum of all the entropies corresponding to the desired estimate.

The performance of certain coding methods is known relative to the lower limit constituted by the entropy. In the case of the Huffman coding method, the mean number of bits required to code a sample of the signal is known to be at most one bit greater than the entropy. Knowing the entropy, or at least an estimate of the entropy, the throughput, or at least an estimate of the throughput which has to be expected, will be known even before coding.

In the process according to the invention, the correlation between bits of like order among the M samples of the signal is taken into account rather than taking into account directly the correlation between the samples per se. The estimate thus obtained is necessarily greater than the value which would be determined through a conventional entropy calculation. However, the number of comparators and counters required for the calculation is reduced to the number of bits in each sample in the case of estimation, this representing an appreciable saving of hardware as compared with the conventional calculation requiring $2^N$ comparators and counters (one comparator and one counter per possible value for the samples).

The subject of the invention is also a device implementing the process.

According to a particular use of the process in accordance with the invention, estimation of the bit budget serves to forecast the throughput of the data leaving the coder.

According to a particular use of the invention, estimation of the bit budget serves to regulate the degree of fill of the video buffer and therefore to adapt the coding to the throughput of the transmission channel.

The process in accordance with the invention can be applied to all kinds of data, be it in the time or frequency domain.

Figure 2:
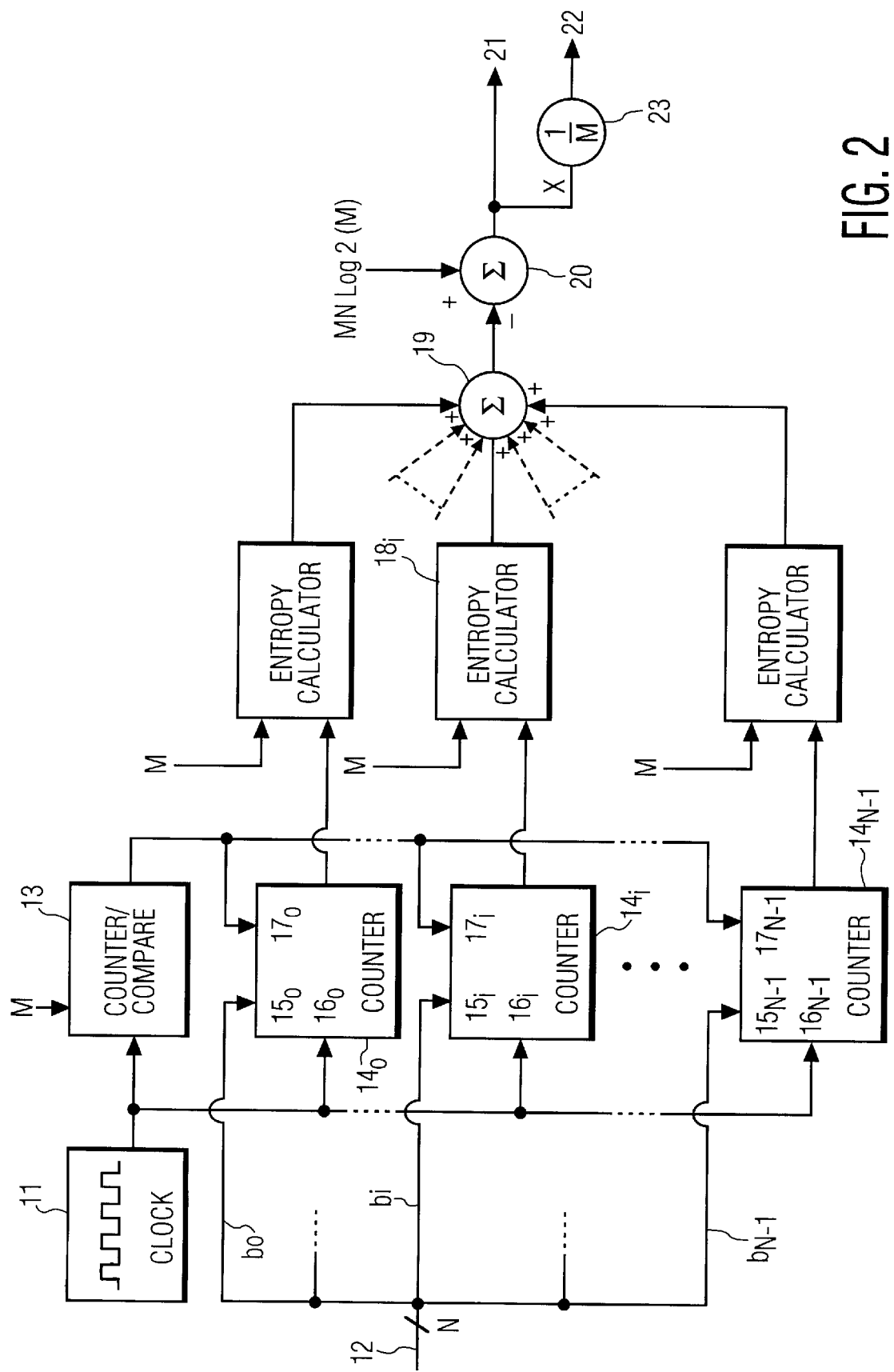
Figure 3:
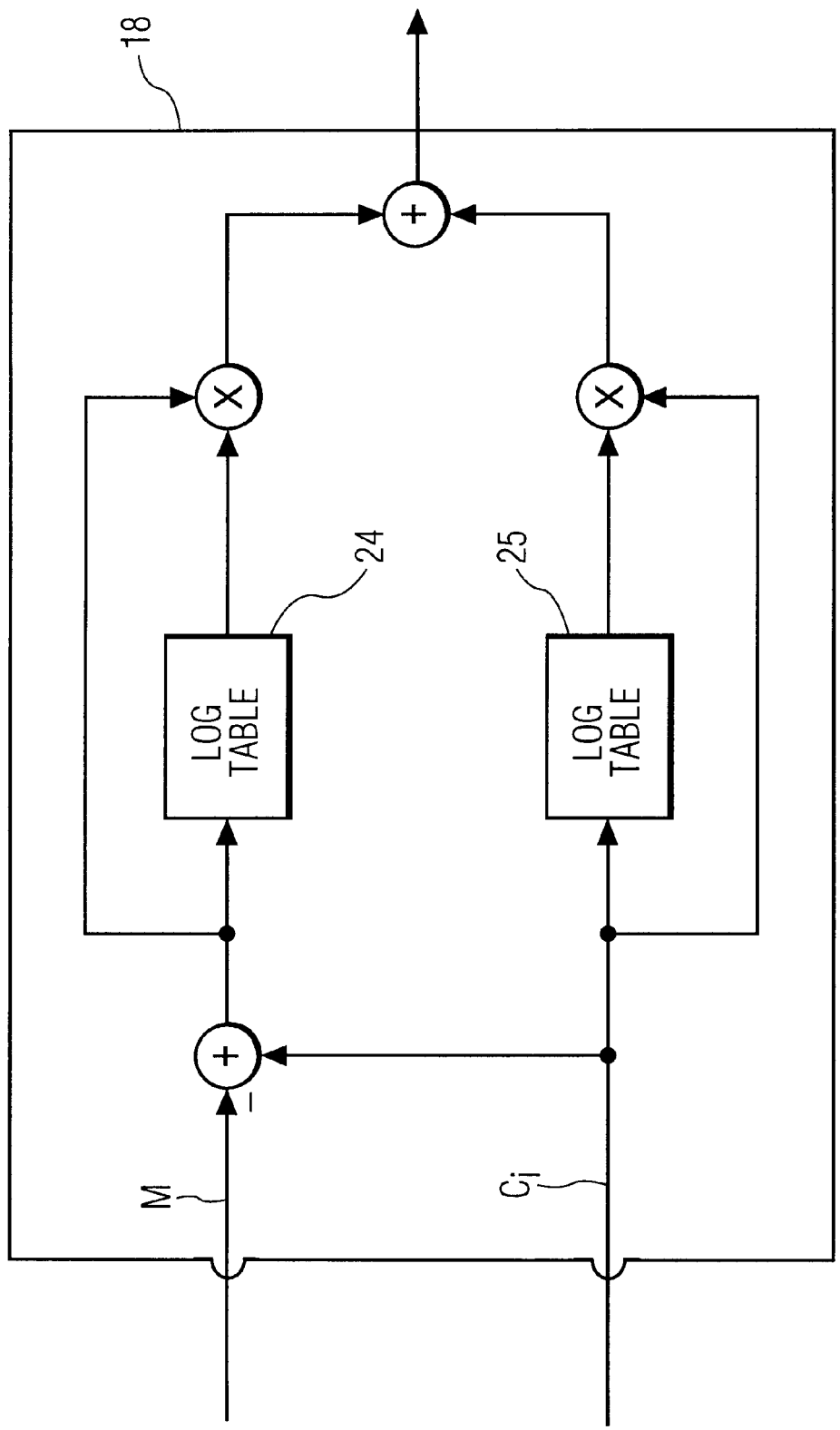

Other advantages of the invention will emerge from the description of the non-limiting preferred embodiment represented by the attached figures in which:

FIG. 1, already described, represents a partial operating diagram of a television signal compression circuit, FIG. 2 represents the operating diagram of an exemplary layout of the process in accordance with the invention, FIG. 3 represents the operating diagram of a circuit for calculating the entropy corresponding to a bit of order $2^i$, the circuit being used in the diagram of FIG. 2.

A sample represented by a binary word of length N is of the form:

$$b_{N-1} b_{N-2} \cdots b_i \cdots b_1 b_0$$

$b_i$ is the bit of order $2^i (0 \leq i \leq N-1)$, each bit being able to take the value 0 or 1.

For each bit $b_i$, the number of times $C_i$ that this bit takes the value 1 in the M samples is determined. The probability that $b_i$ takes the value 1 is then $p_i = C_i / M$. The probability that $b_i$ takes the value 0 is obviously $q_i = 1 - C_i / M$.

The entropy, for this bit, is calculated conventionally by using the formula:

$$H_i = -p_i \log_2 p_i - q_i \log_2 q_i$$

this being equivalent to:

$$H_i = -(C_i/M\mathrm{Log}_2(C_i/M) - (1-C_i/M)\,\mathrm{Log}_2(1-C_i/M)$$

The entropies are next summed for all the bits bi. This sum represents the desired estimate. By summing over the M samples an estimate of the bit budget is obtained. By dividing by M an estimate is obtained of the mean number of bits required to code a word:

$$H_{estimated} = N\mathrm{Log}_2 M - \frac{1}{M}\sum_{i=0}^{N-1}(C_i\mathrm{Log}_2 C_i - (M-C_i)\mathrm{Log}_2(M-C_i))$$

bits/word (1)

FIG. 2 shows an operating diagram of a circuit for estimating the number of bits required to code a signal represented by M N-bit samples. The circuit comprises a clock 11 which is synchronous with the frequency of the data on a bus 12. The clock 11 delivers a strobe when the data are set up on the bus 12.

Each line of the bus 12 corresponds to a bit bi of a sample representing the signal and is connected to the input 15$i$ of an L-bit counter 14$i$. The counters 14$i$ are such that they make it possible to count at least up to M. L will therefore be chosen such that $2^{(L-2)} < M \leq 2^{(L-1)}$. The counters moreover possess a clock input 16$i$, as well as a zero-reset input 17$i$. The clock inputs 16$i$ are connected to the clock 11, whereas the zero-reset inputs are connected to the output of a circuit 13.

The circuit 13 includes a counter and a comparator and delivers a signal on its output each time M clock signals have been counted.

The counters 14$i$ are incremented by one unit if, at the time of the rising edge of the clock 11 on the input 16$i$, the input 15$i$ is at 1.

At the start of an estimation phase, all the counters (counters 14$i$ and counter of the circuit 13) are at zero. Each time At the start of an estimation phase, all the counters (counters 14$i$ and counter of the circuit 13) are at zero. Each time a datum corresponding to a digitized signal arises on the bus 12, the clock 11 sends a pulse. The counters 14$i$ are then incremented if their input 15$i$ is high. The counter of the circuit 13 counts the number of pulses provided by the clock. If this number exceeds M, the circuit 13 resets its own counter and the counters 14$i$ to zero.

According to a variant embodiment, the state of the counter of the circuit 13 is delivered to a further circuit, not represented, which produces a signal when M words have been counted, so as to advise of the time at which a correct result is available at the outputs 21 and 22. The ways of implementing such an embodiment are within the scope of those skilled in the art.

The output of each counter 14$i$ is connected to the input of a corresponding circuit 18$i$ described later. The circuits 18$i$ each deliver the entropy corresponding to the bit bi. The entropies are summed by a summing device 19. The result is deducted from the constant term NlogM of equation (1) by the summing device 20. The output 21 or the output 22 will be chosen depending on whether an estimate is desired of the total number of bits required to code the M samples or of the mean number of bits per sample. The output 21 corresponds directly to the output of the summing device 20, whereas the output 22 corresponds to this output viewed through a divider by M 23.

FIG. 3 represents an operating diagram corresponding to one of the circuits 18$i$. This circuit possesses as input the values of M, as well as the values of Ci corresponding to the number of times a bit bi was at 1 in the M samples.

The circuit principally comprises two logarithmic tables 24 and 25 to the base 2. The particular feature of these circuits is that they deliver a zero at output when a zero is present at their input, even if the log of zero is normally not defined.

The input of the table 24 receives the term M−Ci, whereas the table 25 receives the term Ci. The outputs of the tables each go to a multiplier which moreover receives M−Ci and Ci respectively. The outputs from the two multipliers are next added up to provide the output from the circuit 18$i$.

According to a variant embodiment, a single logarithm memory is used for all the circuits 18$i$, a microprocessor or the like being employed to provide the values from this memory.

According to a variant embodiment, the circuit 13 includes a zero-reset which makes it possible to choose precisely from which sample it is desired to begin estimation, by applying a signal to this input at the requisite time.

The estimate obtained can next be used by the other circuits of the compression device, especially to regulate the degree of fill of the compressed-data buffer or to adapt the quantizing of the coefficients. The interaction of the estimation device according to the invention with the overall device in which it will be installed as well as the regulation per se will be carried out according to one of the layouts known to those skilled in the relevant art.

According to a particular embodiment, estimation of the bit budget is performed in a first pass of the coder, the corresponding result next being used to adapt the quantizing of the coefficients during a second pass in order to obtain the desired bit rate, the second pass terminating with the actual VLC coding, whilst the first pass terminates with estimation of the bit budget according to the process in accordance with the invention.

According to a particular embodiment, estimation by the process in accordance with the invention is obtained after the data have been submitted to a Walsh-Hadamard transformation rather than a DCT transformation. The Walsh-Hadamard transform is simpler to implement than the DCT transform, requiring only additions and subtractions and not multiplications. It will also be possible to use the estimate obtained by virtue of the process in accordance with the invention after a Walsh-Hadamard transformation so as to adapt the quantizing of coefficients obtained by DCT.

Implementations of the process other than that given in the example above are of course possible. It will, in particular, be possible to implement certain steps by means of a microprocessor.

The bit budget estimating process can obviously be used in other applications embracing variable-length coders.

I claim:

1. A process for estimating a bit budget in a circuit for compressing digital data, which data is represented by N-bit coded samples, said process comprising:
   providing the probabilities of respective bits of given order having a given value (0 or 1) out of M binary words representing M samples of the signal; and
   performing an entropy calculation on the basis of said probabilities corresponding to the desired estimate.

2. A process according to claim 1, wherein the number of times $C_i(0 \leq i \leq N-1)$ that a bit of given order possesses the given value is determined out of the M samples of the signal, and from this entropy Hi of this bit is deduced.

3. A process according to claim 2, wherein when the M binary words have been processed, the entropies Hi are summed to obtain the desired estimate of the bit budget.

4. The process set forth in claim 1 wherein said bit budget estimate corresponds to an estimate of a volume of compressed information expected to be produced from variable length coding said digital data.

5. A process for estimating a bit budget in a circuit for compressing digital data, which data is represented by N-bit coded samples, said process comprising:

provide the probabilities of respective bits of given order having a given value (0 or 1) out of M binary words representing M samples of the signal;

performing an entropy calculation on the basis of said probabilities corresponding to the desired estimate; and wherein the estimate of the mean number of bits required to code a word is:

$$H_{estimated} = N\mathrm{Log}_2 M - \frac{1}{M} \sum_{i=0}^{N-1} (C_i \log_2 C_i - (M - C_i) \log_2 (M - C_i))$$

where N is the number of bits per sample, M is the number of samples and $C_i$ is the probability of the bit rank I being equal to a given value.

6. A process for estimating a bit budget in a circuit for compressing digital data, which data is represented by N-bit coded samples, said process comprising:

providing the probabilities of respective bits of given order having a given value (0 or 1) out of M binary words representing M samples of the signal;

counting the number of times bit of respective orders exhibit said given value in a sequence of M samples to form N sums;

performing an entropy calculation for each of said N sums to form N entropy values; and combining the N entropy values.

\* \* \* \* \*